United States Patent
Sung et al.

(10) Patent No.: US 9,023,164 B2
(45) Date of Patent: May 5, 2015

(54) SEALANT DISPENSER AND A METHOD OF SEALING A DISPLAY PANEL USING THE SAME

(71) Applicant: Samsung Display Co., Ltd., Yongin, Gyeonggi-Do (KR)

(72) Inventors: Byoung-Hun Sung, Hwaseong-si (KR); Young-Gu Kim, Hwaseong-si (KR); Baek-Kyun Jeon, Yongin-si (KR); Jin-Soo Jung, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 312 days.

(21) Appl. No.: 13/658,202

(22) Filed: Oct. 23, 2012

(65) Prior Publication Data

US 2013/0340921 A1 Dec. 26, 2013

(30) Foreign Application Priority Data

Jun. 20, 2012 (KR) ........................ 10-2012-0066304

(51) Int. Cl.
*B05C 5/02* (2006.01)
*B32B 37/12* (2006.01)
*B05C 11/10* (2006.01)
*G02F 1/13* (2006.01)
*G02F 1/1339* (2006.01)
*H01L 51/52* (2006.01)

(52) U.S. Cl.
CPC ........... *B05C 5/0216* (2013.01); *B05C 11/1002* (2013.01); *H01L 51/5246* (2013.01); *H01L 51/525* (2013.01); *G02F 1/1303* (2013.01); *G02F 1/1339* (2013.01)

(58) Field of Classification Search
CPC . B05C 5/0216; B05C 11/1002; G02F 1/1339; G02F 1/1303; H01L 51/525; H01L 51/5246
See application file for complete search history.

(56) References Cited

U.S. PATENT DOCUMENTS

| | | | | |
|---|---|---|---|---|
| 5,415,693 | A * | 5/1995 | Yoneda et al. | 118/664 |
| 6,299,931 | B1 * | 10/2001 | Leary et al. | 427/8 |
| 7,271,904 | B2 * | 9/2007 | Jung et al. | 356/394 |
| 7,377,979 | B2 * | 5/2008 | Sakayori et al. | 118/323 |
| 7,595,083 | B2 | 9/2009 | Jung et al. | |
| 7,969,547 | B2 | 6/2011 | Kim et al. | |
| 8,225,743 | B2 * | 7/2012 | Jung et al. | 118/712 |

* cited by examiner

*Primary Examiner* — Jeff Aftergut
(74) *Attorney, Agent, or Firm* — Cantor Colburn LLP (57) ABSTRACT

In a sealant dispenser and a method of sealing a display panel using the sealant dispenser, the sealant dispenser includes a tracking part, a nozzle part and a body. The tracking part tracks a tracking line on a base substrate, the base substrate is divided into a display area and a non-display area. The nozzle part is spaced apart from the tracking part, and injects a sealant from an end portion of the nozzle part and forms a seal line on the base substrate at a same time the tracking part tracks the tracking line. The tracking part and the nozzle part are mounted on the body.

8 Claims, 8 Drawing Sheets

SEALANT DISPENSER AND A METHOD OF SEALING A DISPLAY PANEL USING THE SAME

This application claims priority to Korean Patent Application No. 10-2012-0066304, filed on Jun. 20, 2012, and all the benefits accruing therefrom under 35 U.S.C. §119, the contents of which in its entirety is herein incorporated by reference.

BACKGROUND

1. Field

Exemplary embodiments of the invention relate to a sealant dispenser and a method of sealing a display panel using the sealant dispenser. More particularly, exemplary embodiments of the invention relate to a sealant dispenser used for manufacturing a display apparatus and a method of sealing a display panel using the sealant dispenser.

2. Description of the Related Art

Generally, a liquid crystal display ("LCD") apparatus which drives a liquid crystal to provide various images, includes a display panel receiving light and displaying an image in a display area. Here, the display panel includes first and second substrates combined with each other, and a liquid crystal layer is disposed between the first and second substrates. The display panel includes a sealing part sealing an outside of the liquid crystal layer, such as outside of the display area, to prevent the liquid crystal layer from leaking from between the first and second substrates. Conventionally, the sealing part is formed via ink-jetting a sealant or via a gravure printing process.

Further, a display apparatus using an organic light emitting diode ("OLED") also includes a display panel having the sealing part as explained above.

Since the sealing part is formed at an outline of and outside of the display area of the display panel, an area of a non-display area of the display panel undesirably increases. A portion of the display apparatus outside of the non-display area of the display panel may otherwise be referred to as a bezel. However, as demand for a slim-size television or a digital information display ("DID") increases, studies on decreasing the area of the non-display area of the display panel are pursued to decrease a size of the bezel.

SUMMARY

One or more exemplary embodiment of the invention provides a sealant dispenser capable of decreasing a positioning error.

One or more exemplary embodiment of the invention also provides a method of sealing a display panel using the sealant dispenser.

In an exemplary embodiment of a sealant dispenser according to the invention, the sealant dispenser includes a tracking part, a nozzle part and a body. The tracking part tracks a tracking line on a base substrate of a display panel, and the base substrate is divided into a display area and a non-display area. The nozzle part is spaced apart from the tracking part, and injects a sealant at an end portion of the nozzle part to form a seal line at the same time when the tracking part tracks the tracking line. The tracking part and the nozzle part are mounted on the body.

In an exemplary embodiment, the display area of the base substrate may include a plurality of gate lines extending a first direction, a plurality of data lines extending a second direction crossing the first direction, and column spacers respectively extending along the first and second directions.

In an exemplary embodiment, the tracking line may be one of the gate lines or one of the data lines.

In an exemplary embodiment, the tracking line may be an outermost gate line of the gate lines, or an outermost data line of the data lines.

In an exemplary embodiment, the non-display area of the base substrate may include a column spacer dam line substantially parallel with the column spacers. The tracking line may be the column spacer dam line.

In an exemplary embodiment, the display area of the base substrate may include a plurality of color filters respectively extending along first and second directions crossing each other, and a light blocking layer extending between adjacent color filters.

In an exemplary embodiment, the tracking line may be the light blocking layer.

In an exemplary embodiment, the light blocking layer tracked by the tracking part may be between an outermost color filter of the color filters and a color filter adjacent to the outermost color filter.

In an exemplary embodiment, the non-display area of the base substrate may include a color filter dam line substantially parallel with an outermost color filter of the color filters. The tracking line may be the color filter dam line.

In an exemplary embodiment, the tracking part may include a charge-coupled device ("CCD") camera.

In an exemplary embodiment, the seal line may be in the non-display area of the base substrate.

In an exemplary embodiment, a distance between the tracking part and the nozzle part may changeable on the body, according to a position of the tracking line tracked by the tracking part.

In an exemplary embodiment of a method of sealing a display panel according to the invention, a first substrate and a second substrate facing each other are provided. A tracking line on the first substrate or the second substrate is tracked and a seal line is formed to be spaced apart from the tracking line by a predetermined distance on the first substrate or the second substrate, respectively, at the same time, using a sealant dispenser. The first substrate is combined with the second substrate. A liquid crystal is provided between the first and second substrates.

In an exemplary embodiment, the first substrate may include a first base substrate, a plurality of gate lines on the first base substrate and extending along a first direction, and a plurality of data lines on the first base substrate and extending along a second direction crossing the first direction. The tracking line may be one of the gate lines or one of the data lines.

In an exemplary embodiment, the tracking line may be a pair of outermost gate lines at opposite sides of the first substrate, and a pair of outermost data lines at opposite sides of the first substrate.

In an exemplary embodiment, the first substrate may include a plurality of column spacers respectively extending along first and second directions crossing each other, and a column spacer dam line substantially parallel with the column spacers. The tracking line may be the column spacer dam line.

In an exemplary embodiment, the second substrate may include a second base substrate, and a light blocking layer on the base substrate and extending along each of first and second directions crossing each other. The tracking line may be the light blocking layer.

In an exemplary embodiment, the second substrate may include a plurality of color filters respectively extending along first and second directions crossing each other, and a color filter dam line substantially parallel with the color filters. The tracking line may be the color filter dam line.

In an exemplary embodiment, the method may further include optimizing a distance between a tracking part and a nozzle part of the sealant dispenser, by considering a position of the tracking line which is on the first substrate or the second substrate and a desired position of the seal line on the first substrate or the second substrate, respectively, before forming the seal line in tracking the tracking line.

In an exemplary embodiment, the seal line may be formed in the non-display area of the display panel.

According to one or more exemplary embodiment of the invention, the sealant dispenser includes the tracking part and the nozzle part and thus tracks the tracking line and injects the sealant at the same time. Thus, a distance between the tracking line and the seal line may be uniformly maintained and a positioning error of the seal line may be decreased.

In one or more exemplary embodiment, for example, the tracking line tracked by the tracking part may be formed via photolithography and thus the positioning error of the tracking line is very small. Thus, the positioning error of the seal line may be decreased.

In addition, the tracking line may be one of the lines on the first substrate including a switching element, for example, the gate line, the data line, the color spacer dam line, and so on, or one of the lines on the second substrate facing the first substrate, for example, a line of the light blocking layer, the color filter dam line, and so on. Thus, an optimal tracking line may be selected based on a design of the display panel. Here, even though the tracking line is changeable, the distance between the tracking part and the nozzle part is changeable, and thus the seal line may be formed in substantially a same location.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

In forming a display apparatus, a positioning error by a sealant of the sealant part or a thickness error by the sealant may undesirably cause a non-display area of a display panel and/or a bezel of the display apparatus to increase. For example, the sealant formed close to the display area due to the above-mentioned forming error may undesirably contact liquid crystal of a liquid crystal layer, or may fail to maintain a sealing gap of the display panel. Alternatively, the sealant formed far away from the display area may be cracked in a cell-cutting manufacturing process. Further, the above-mentioned forming error may cause an electrical short circuit of a conductive line on the display panel.

Figure 1:
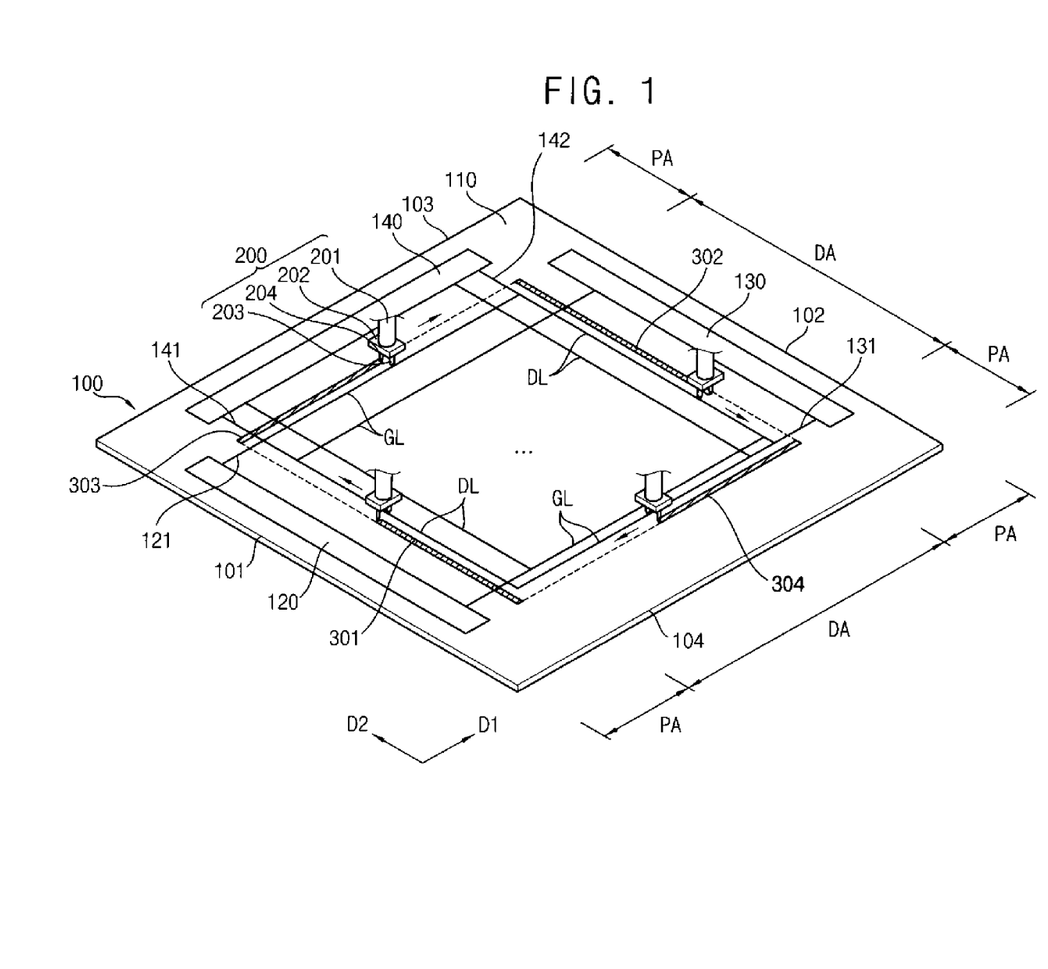
FIG. 1 is a perspective view illustrating an exemplary embodiment of a method of providing a sealant using a sealant dispenser according to the invention.

FIG. 1 is a perspective view illustrating an exemplary embodiment of a method of providing a sealant using a sealant dispenser according to the invention.

Referring to FIG. 1, an exemplary embodiment of a sealant dispenser 200 includes a supporter 201, a body 202, a tracking part 203 and a nozzle part 204. The sealant dispenser 200 forms a seal line 301, 302, 303 and 304 from a sealant material, on a base substrate 110, as illustrated in FIG. 1. Here, the base substrate 110 may be included in a display panel of a display apparatus, and a switching element may be on the base substrate 110. Hereinafter, an exemplary embodiment of a method of forming the seal line 301, 302, 303 and 304 on the base substrate 110 using the sealant dispenser 200 will be explained.

The base substrate 110 included in the display panel and the switching element on the base substrate 110 is explained below.

The base substrate 110 includes first and second sides 101 and 102 substantially parallel with each other, and third and fourth sides 103 and 104 substantially parallel with each other. The first and second sides 101 and 102 are substantially parallel with a second direction D2, and the third and fourth sides 103 and 104 are substantially parallel with a first direction D1 crossing the second direction D2. The first to fourth sides 101 to 104 may be defined by the outer edges or the outer side surfaces of the base substrate 110. Here, the first and second directions D1 and D2 may be substantially perpendicular to each other, but are not limited thereto or thereby. In one exemplary embodiment, for example, the base substrate 110 may be a rectangular plate shape.

A plurality of gate lines GL is on the base substrate 110. The gate lines GL are connected to and extend from a first gate driver 120 or are connected to and extend from a second gate driver 130, in the first direction D1. The first gate driver 120 is adjacent to the first side 101, and the second gate driver 130 is adjacent to the second side 102. In the exemplary embodiment, the first and second gate drivers 120 and 130 are opposite to each other. Alternatively, only one of the first and second gate drivers 120 and 130 is adjacent to one of the first and second sides 101 and 102, and the gate lines GL may be driven by the one gate driver.

In addition, a plurality of data lines DL is on the base substrate 110. The data lines DL are connected to and extend from a data driver 140 in the second direction D2. The data driver 140 is adjacent to the third side 103.

The gate lines GL and the data lines DL cross each other. The gate lines GL are substantially parallel with each other and are arranged along the second direction D2, and the data lines DL are substantially parallel with each other and are arranged along the first direction D1.

In addition, although not shown in figures, the base substrate 110 includes a pixel area, and switching elements electrically connected to the data lines DL and the gate lines GL, respectively.

In the exemplary embodiment, the gate lines GL extending from the first gate driver 120 and the gate lines GL extending from the second gate driver 130 are alternately disposed with each other in the second direction D2. An outermost gate line GL at a first end portion of the gate lines GL along the second direction D2 is defined as a first gate line 121, and an outermost gate line GL at a second end portion of the gate lines GL opposite to the first end portion along the second direction D2 is defined as an n-th gate line 131. Here, the first gate line 121 extends from the first gate driver 120, and the n-th gate line 131 extends from the second gate driver 130.

In addition, an outermost data line DL at a first end portion of the data lines DL along the first direction D1 is defined as a first data line 141, and an outermost data line formed at a second end portion of the data lines DL opposite to the first end portion along the first direction D1 is defined as an m-th data line 142. In one exemplary embodiment, the base substrate 110 may be divided into a display area DA and a non-display area PA. The display area DA may be surrounded by the first gate line 121, the n-th gate line 131, the first data line 141 and the m-th data line 142, and an image is displayed through the display area DA. The non-display area PA is an area of the base substrate 110 except for the display area DA.

The exemplary embodiment of the sealant dispenser 200 forms the seal line 301, 302, 303 and 304 on the non-display area PA of the base substrate 110.

In one exemplary embodiment, for example, the supporter 201 of the sealant dispenser 200 is connected to a remote controller (not shown) and thus, a movement of the sealant dispenser 200 may be controlled by the remote controller.

The tracking part 203 and the nozzle part 204 are mounted on the body 202, and the tracking part 203 and the nozzle part 204 move at a same time according to a movement of the supporter 201.

The tracking part 203 is mounted on the body 202 and faces the base substrate 110. The tracking part 203 may include a sensing member, such as a camera equipped at an end portion of the tracking part 203. The tracking part 203 including the sensing member follows a tracking line on the base substrate 110. Here, the camera equipped at the end portion of the tracking part 203 may be a charge-coupled device ("CCD") camera, but is not limited thereto or thereby.

The tracking line followed by the camera of the tracking part 203 may be an arbitrary line on the base substrate 110. In the exemplary embodiment, the tracking line may be the gate line or the data line on the base substrate 110, but is not limited thereto or thereby. As mentioned above, the seal line 301, 302, 303 and 304 is normally in the non-display area PA of the base substrate 110, and thus the tracking line may be the first and n-th gate lines 121 and 131 of the gate lines GL and/or the first and n-th/m-th data lines 141 and 142 of the data lines DL, to minimize a positioning error and to optimize a space occupied by the sealant dispenser 200, but is not limited thereto or thereby.

In one exemplary embodiment, for example, the tracking part 203 tracks the first data line 141 near the first side 101 of the base substrate 110, tracks the m-th data line 142 near the second side 102 of the base substrate 110, tracks the first gate line 121 near the third side 103 of the base substrate 110, and tracks the n-th gate line 131 near the fourth side 104 of the base substrate 110. In addition, the tracking part 203 may track the first data line 141, the first gate line 121, the m-th data line 142 and the n-th gate line 131 sequentially in a clockwise direction, but the invention is not limited thereto or thereby.

The nozzle part 204 is mounted on the body 202 to face the base substrate 110. The nozzle part 204 includes a dispensing member such as a nozzle at an end portion of the nozzle part 204 to inject the sealant toward the base substrate 110. The nozzle part 204 injects the sealant at a same time the tracking part 203 tracks the tracking line on the base substrate 110, to form the seal line 301, 302, 303 and 304 on the base substrate 110.

The nozzle part 204 is spaced apart from the tracking part 203 by a predetermined distance on the body 202. Thus, the seal line 301, 302, 303 and 304 is spaced apart from the tracking line by the predetermined distance between the nozzle part 204 and the tracking part 203, on the base substrate 110. Thus, a positioning error of the seal line 301, 302, 303 and 304 with respect to the tracking line is negligible and the seal line may be more accurately positioned. The positioning error in conventionally forming the seal line is normally between about 0.2 millimeter (mm) and about 0.3 mm.

In contrast, in one or more embodiment of forming the seal line, the positioning error may be within about 0.001 mm. Thus, the seal line may be more accurately positioned.

The seal line is in the non-display area PA of the base substrate 110, and thus the nozzle part 204 is spaced apart from the tracking part 203 in a direction toward the non-display area PA.

In one exemplary embodiment, for example, when the tracking part 203 tracks the first data line 141, the nozzle part 204 is disposed between the first side 101 and the first data line 141 and injects the sealant on the base substrate 110. Likewise, when the tracking part 203 tracks the first gate line 121, the nozzle part 204 is disposed between the third side 103 and the first gate line 121 and injects the sealant on the base substrate 110. In addition, when the tracking part 203 tracks the m-th data line 142, the nozzle part 204 is disposed between the second side 102 and the mn-th data line 142 and injects the sealant on the base substrate 110. In addition, when the tracking part 203 tracks the n-th gate line 131, the nozzle part 204 is disposed between the fourth side 104 and the n-th gate line 131 and injects the sealant on the base substrate 110.

The nozzle part 204 and the tracking part 203 may be moveable with respect each other, on the body 202 A distance between the nozzle part 204 and the tracking part 203 on the body 202 may be changeable. Thus, the distance between the nozzle part 204 and the tracking part 203 may be changed considering positions of the base substrate 110 including the seal line and a corresponding tracking line. Accordingly, the seal line may be formed in a predetermined position of the base substrate 110.

In one exemplary embodiment, for example, even though the tracking part 203 may tracks a gate line GL or a data line DL which is different from the outermost gate lines GL or the outermost data lines DL as illustrated in FIG. 1, the distance between the nozzle part 204 and the tracking part 203 may be changed and thus the seal line may still be formed in the predetermined position of the base substrate 110. However, as the distance between the nozzle part 204 and the tracking part 203 increases, a volume of the body 202 increases. Thus, to minimize the body 202 of the tracking part 203, the tracking part 203 tracks a signal line, such as the gate line or the data line, closest to the predetermined position of the seal line 301, 302, 303 and 304.

Figure 2:
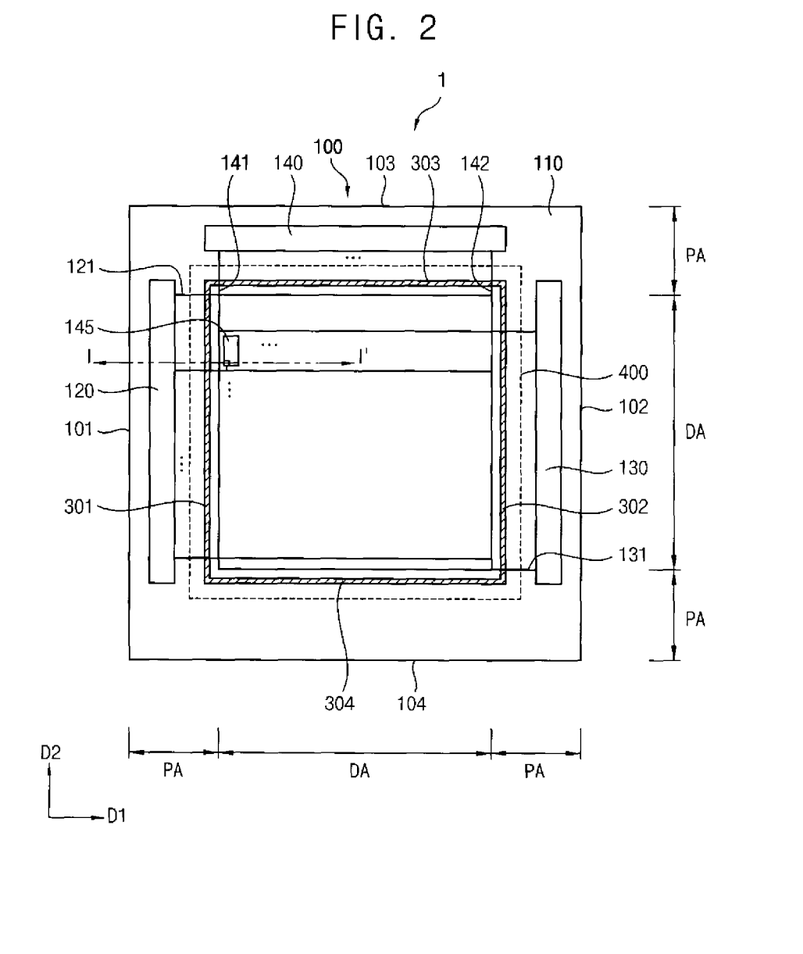
FIG. 2 is a plan view illustrating an exemplary embodiment of a display panel sealed using the sealant dispenser of FIG. 1.
Figure 3:
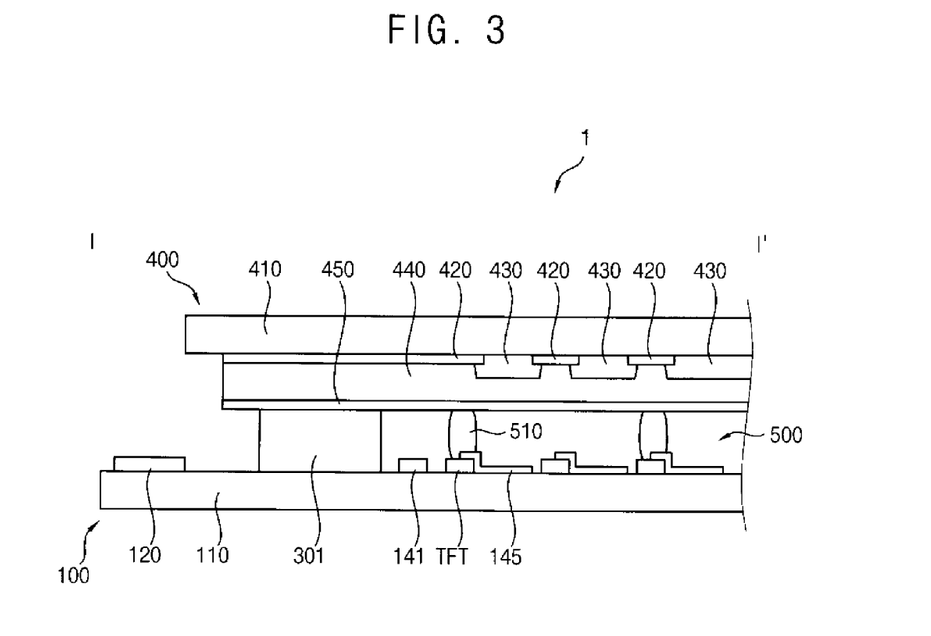
FIG. 3 is a cross-sectional view taken along line I-I' of FIG. 2.

FIG. 2 is a plan view illustrating an exemplary embodiment of a display panel 1 sealed using the sealant dispenser of FIG. 1. FIG. 3 is a cross-sectional view taken along line I-I' of FIG. 2.

Referring to FIGS. 2 and 3, the display panel 1 includes first and second substrates 100 and 400 combined with each other, and a liquid crystal layer including a liquid crystal 500 between the first and second substrates 100 and 400.

The first substrate 100 includes the first base substrate 110 (which is substantially the same as the base substrate 110 in FIG. 1, and hereinafter called the first base substrate), and first and second gate drivers 120 and 130, gate lines GL, a data driver 140, data lines DL, a switching element TFT and a pixel electrode 145 on the first base substrate 110. The gate lines GL are connected to and extend from the first and second gate drivers 120 and 130. The data lines DL are connected to and extend from the data driver 140. The switching element TFT is electrically connected to the gate lines GL and the data lines DL. The pixel electrode 145 is electrically connected to the switching element TFT.

The second substrate 400 includes a second base substrate 410, a light blocking layer 420 and color filters 430 on the second base substrate 410, a protecting layer 440 on the light blocking layer 420 and the color filters 430, and a common electrode 450 on the protecting layer 440.

A column spacer 510 is disposed between the first and second substrates 100 and 400 to maintain a cell gap between the first and second substrates 100 and 400. In addition, the non-display area PA of the display panel 1 is enclosed by a sealing member in a seal line 301 to reduce or effectively prevent leaking of the liquid crystal 500 injected between the first and second substrates 100 and 400.

The seal line 301, 302, 303 and 304 is formed using the sealant dispenser 200 as illustrated in FIG. 1. In one exemplary embodiment of forming the seal line 301, 302, 303 and 304, for example, the tracking part 203 of the sealant dispenser 200 tracks the first data line 141, the first gate line 121, the m-th data line 142 and the n-th gate line 131 on the first base substrate 110, and the nozzle part 204 injects sealant material on the first base substrate 110 at the same time, to form the seal line 301. Thus, the seal line 301, 302, 303 and 304 is spaced apart from the tracking line which is tracked by the tracking part 203, in the non-display area PA, by a predetermined distance.

Figure 4A:
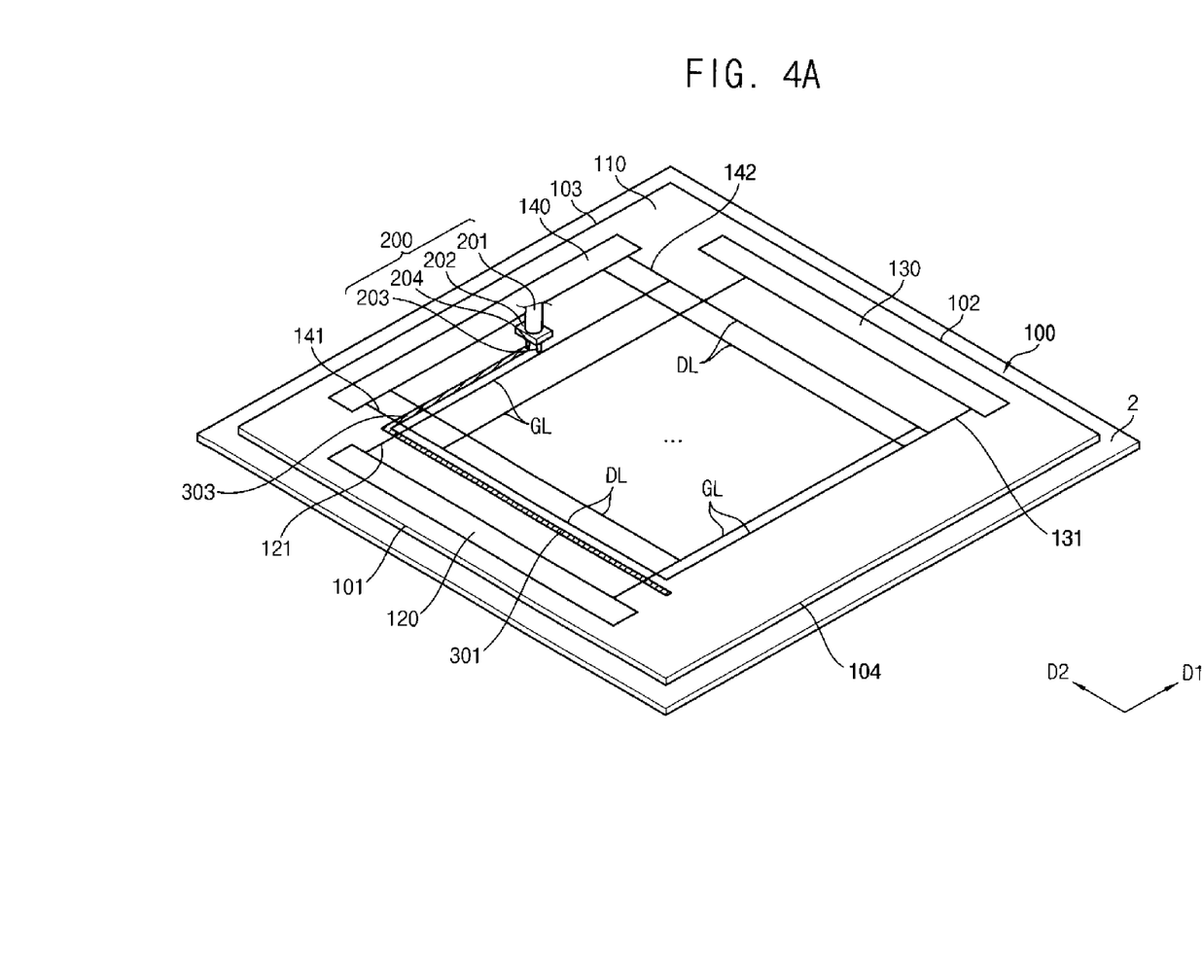
FIGS. 4A and 4B are perspective views illustrating an exemplary embodiment of a method of sealing the display panel of FIG. 2.
Figure 4B:
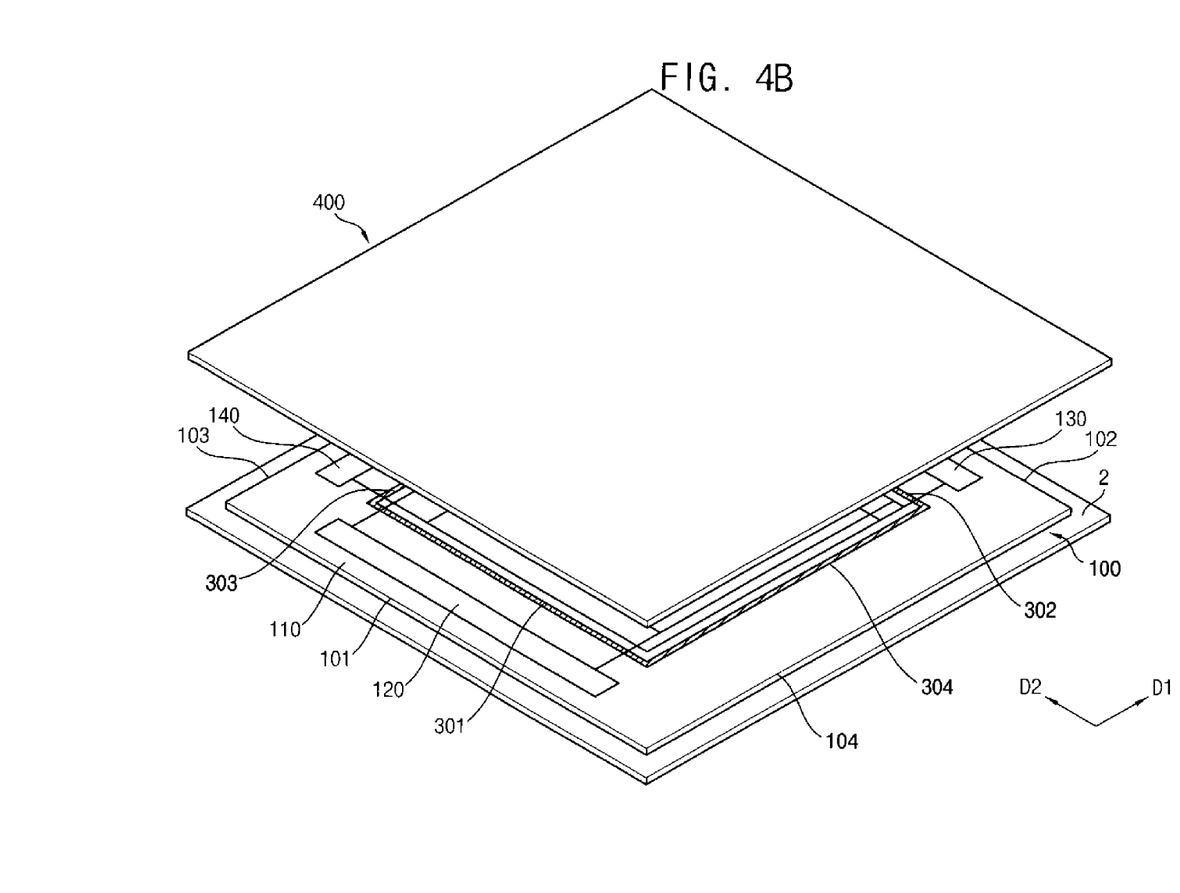

FIGS. 4A and 4B are perspective views illustrating an exemplary embodiment of a method of sealing the display panel of FIG. 2.

Referring to FIG. 4A, the first base substrate 110 is provided on a mother board 2. Here, a plurality of first base substrates 110 may be provided on the mother board 2, but single first base substrate 100 is provided on the bother board 2 for the convenience of explanation. However, the process explained below for the single first base substrate 100 may be substantially the same as for each of the plurality of first base substrates 110.

The first and second gate drivers 120 and 130, and the data driver 140, are on the first base substrate 110. Then, the gate lines GL connected to and extending from the first and second gate drivers 120 and 130 along the first direction D1, and the data lines DL connected to and extending from the data driver 140 along the second direction D2 are in the display area DA and on the first base substrate 110.

Then, the seal line 301, 302, 303 and 304 is formed on the first base substrate 110, using the sealant dispenser 200. In one exemplary embodiment, for example, the tracking part 203 of the sealant dispenser 200 tracks the first data line 141 on the first base substrate 110 and moves along the second direction D2, and the nozzle part 204 forms the first seal line 301 between the first data line 141 and the first side 101 of the base substrate 110, at the same time. Then, the tracking part 203 tracks the first gate line 121 and moves along the first direction D1, and the nozzle part 204 forms the third seal line 303 between the first gate line 121 and the third side 103 of the base substrate 110, at the same time. Then, the tracking part 203 tracks the m-th data line 142 and moves along the second direction D2, and the nozzle part 204 forms the second seal line 302 between the m-th data line 142 and the second side 102 of the base substrate 110, at the same time. Then, the tracking part 203 tracks the n-th gate line 131 and moves along the first direction D1, and the nozzle part 204 forms the fourth seal line 304 between the n-th gate line 131 and the fourth side 104 of the base substrate 110, at the same time.

Accordingly, the first substrate 100 including the formed seal line 301, 302, 303 and 304 is completed.

Referring to FIG. 4B, a second substrate 400, including the light blocking layer 420 and the color filter 430 on the second base substrate 410, is completed. The first and second substrates 100 and 400 are combined with each other. Then, the liquid crystal 500 is injected between the first and second substrates 100 and 400 and sealed, and thus the display panel 1 is completed.

Figure 5:
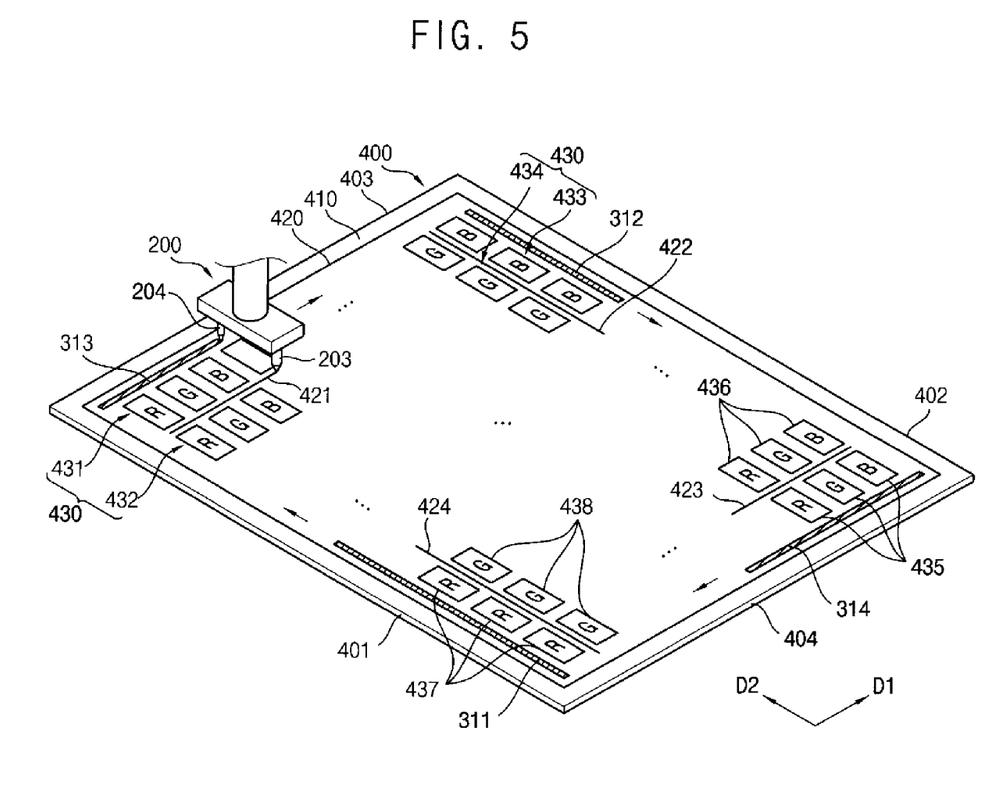
FIG. 5 is a perspective view illustrating another exemplary embodiment of a method of providing a sealant according to the invention.

FIG. 5 is a perspective view illustrating another exemplary embodiment of a method of providing a sealant according to the invention. substantially the same as the method according to the previous exemplary embodiment in FIG. 1, except that the tracking part 203 of the sealant dispenser 200 tracks the light blocking layer 420 on the second base substrate 410 and the nozzle part 204 forms the seal line on the second base substrate 410, and thus same reference numerals are used for same elements and any repetitive explanation will be omitted.

Referring to FIG. 5, the tracking part 203 tracks the light blocking layer 420 on the second base substrate 410, and the nozzle part 204 forms the seal line on the second base substrate 410, at the same time.

In one exemplary embodiment, for example, the plurality of color filters 430 is on the second base substrate 410, and the color filters 430 are spaced apart from each other in the display area DA along the first and second directions D1 and D2. For the convenience of explanation, the color filters 430 are arranged as an order of R-G-B-R- along the first direction D1, as illustrated in FIG. 5.

As explained above, the distance between the nozzle part 204 and the tracking part 203 may be changed, but as the distance decreases, the volume of the body 202 decreases, and thus the space may be used more efficiently. Accordingly, in the exemplary embodiment in FIG. 5, the tracking part 203 tracks the outermost line of the lines on the second base substrate 410.

The light blocking layer 420 may have portions including a continuous solid outer edge. In addition, the color filters 430 are not continuous on the second base substrate 410.

That is, the color filters 430 are discrete elements have outer edges separated from each other. Since outer edges of the color filters 430 are discontinuous, a tracking line defined by the discrete color filters 430 may not be continuous. The tracking part 203 may fail to track the tracking line when the tracking part 203 tracks the discrete color filters 430. Thus, in the exemplary embodiment of FIG. 5, the tracking part 203 tracks the light blocking layer 420 between adjacent color filters 430.

In one exemplary embodiment, for example, in forming first seal line 311 adjacent to a first side 401 of the second base substrate 410, the tracking part 203 tracks a light blocking layer portion 424 extending in the second direction and between a first row of color filters R-R-R- 437 adjacent to the first side 401 and a second row of color filters G-G-G- 438 adjacent to the first row of color filters R-R-R- 437, and at the same time, the nozzle part 204 injects the sealant. Thus, the first seal line 311 is formed between the first side 401 and the first row of color filters R-R-R- 437.

Likewise, in forming the third seal line 313 adjacent to a third side 403 of the second base substrate 410, the tracking part 203 tracks a light blocking layer portion 421 extending in the first direction D1 and between a first column of color filters R-G-B- 431 adjacent to the third side 403 and a second column of color filters R-G-B- 432 adjacent to the first row of color filters R-G-B- 431, and at the same time, the nozzle part 204 injects the sealant. Thus, the third seal line 313 is formed between the third side 403 and the first column of color filters R-G-B- 431.

In addition, in forming the second seal line 312 adjacent to a second side 402 of the second base substrate 410, the tracking part 203 tracks a light blocking layer portion 422 extending in the second direction D2 and between a first row of color filters B-B-B- 433 adjacent to the second side 402 and a second row of color filters G-G-G- 434 adjacent to the first row of color filters B-B-B- 433, and at the same time, the nozzle part 204 injects the sealant. Thus, the second seal line 312 is formed between the second side 402 and the first row of color filters B-B-B- 433.

Further, in forming the fourth seal line 314 adjacent to a fourth side 404 of the second base substrate 410, the tracking part 203 tracks a light blocking layer portion 423 extending in the first direction D1 and between a first column of color filters B-G-R- 435 adjacent to the fourth side 404 and a second column of color filters B-G-R- 436 adjacent to the first column of color filters B-G-R- 435, and at the same time, the nozzle part 204 injects the sealant. Thus, the fourth seal line 314 is formed between the fourth side 404 and the first column of color filters B-G-R- 435.

Figure 6:
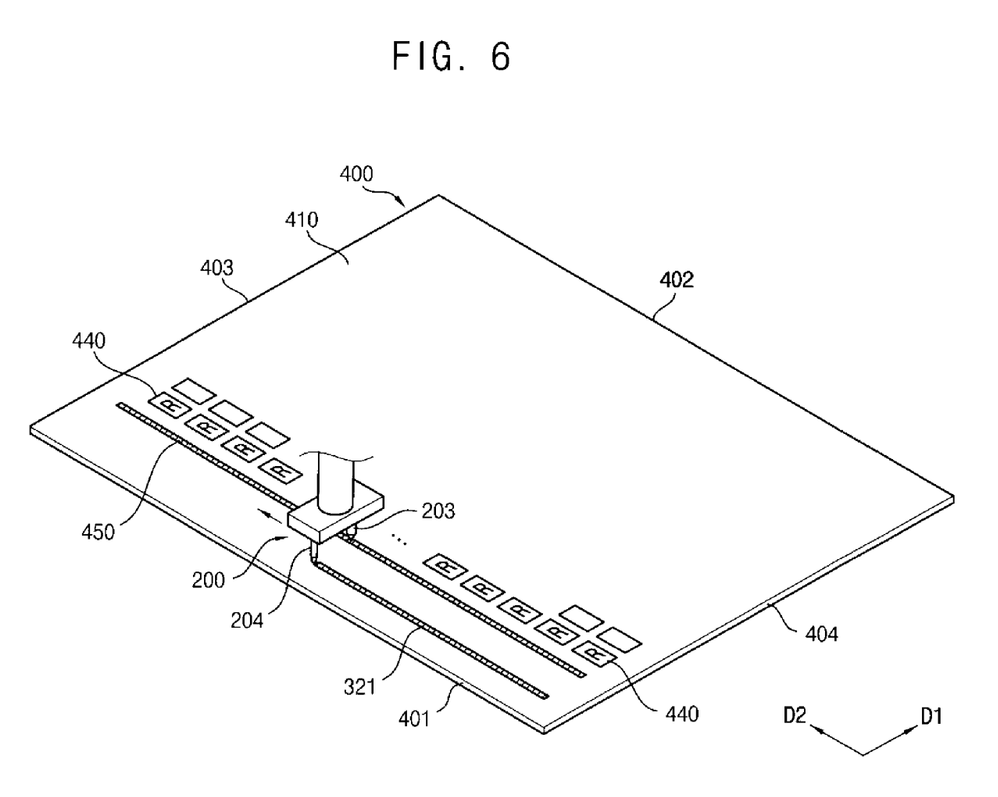
FIG. 6 is a perspective view illustrating still another exemplary embodiment of a method of providing a sealant according to the invention.

FIG. 6 is a perspective view illustrating still another exemplary embodiment of a method of providing a sealant according to the invention.

The exemplary embodiment of the method of providing the sealant in FIG. 6 is substantially the same as the method according to the previous exemplary embodiment in FIG. 1, except that the tracking part 203 of the sealant dispenser 200 tracks a color filter dam line 450 on the second base substrate 410 and the nozzle part 204 forms the seal line on the second base substrate 410, and thus same reference numerals are used for same elements and any repetitive explanation will be omitted.

Referring to FIG. 6, when red R color filters 440 are formed along the second direction D2 on the second base substrate 410, a red color filter dam line 450 is formed adjacent to the red R color filters 440, at the same time. The color filter dam line 450 may be formed at the same time when outermost color filters are formed, and may be formed in the non-display area PA outside of the color filters for protecting the display area DA from foreign matter.

In the exemplary embodiment in FIG. 6, the tracking part 203 of the sealant dispenser 200 tracks the color filter dam line 450, and at the same time, the nozzle part 204 injects the sealant to form a seal line 321 between the first side 401 of the second base substrate 410 and the red R color filters 440.

Although, not shown in figure, additional color filter dam lines may be formed in forming the outermost color filters, such as the color filters adjacent to the second, third and fourth sides 402, 403 and 404 of the second base substrate 410. Thus, the tracking part 203 tracks the additional color filter dam lines and the nozzle part 204 injects the sealant at the same time, to form additional seal lines adjacent to each of the second, third and fourth sides 402, 403 and 404 of the second base substrate 410.

Figure 7:
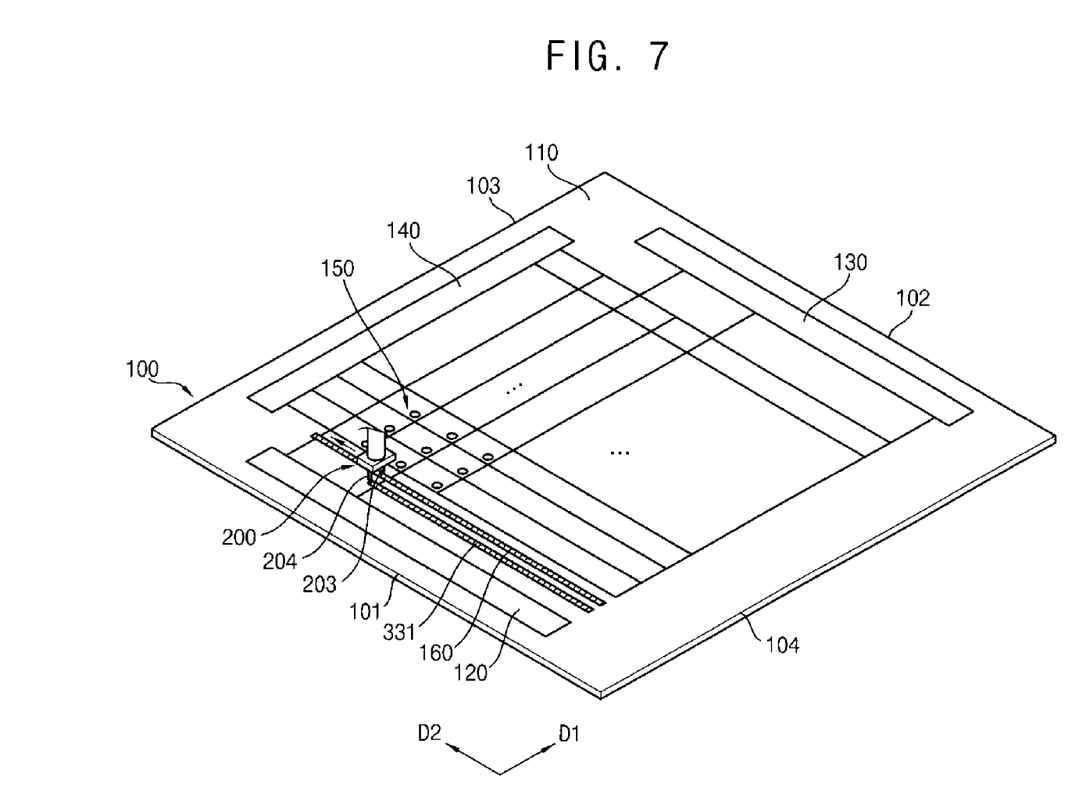
FIG. 7 is a perspective view illustrating still another exemplary embodiment of a method of providing a sealant according to the invention.

FIG. 7 is a perspective view illustrating still another exemplary embodiment of a method of providing a sealant according to the invention.

The exemplary embodiment of the method of providing the sealant in FIG. 7 is substantially the same as the method according to the previous exemplary embodiment in FIG. 1, except that the tracking part 203 of the sealant dispenser 200 tracks a column spacer dam line 160 on the first base substrate 110 and the nozzle part 204 forms the seal line on the first base substrate 110, and thus same reference numerals are used for same elements and any repetitive explanation will be omitted.

Referring to FIG. 7, the first base substrate 110 includes a switching element, and a column spacer 150 to maintain a cell gap between the first and second substrates 100 and 400. The first base substrate 110 may include a plurality of column spacers 150. Here, the column spacer dam line 160 is formed substantially parallel with the column spacers 150 at the same time in forming the column spacers 150. The column spacer dam line 160 may be formed adjacent to outermost column spacers 150. The column spacer dam line 160 is formed in the non-display area, and protects the display area from the foreign matter.

In the exemplary embodiment in FIG. 7, the tracking part 203 of the sealant dispenser 200 tracks the column spacer dam line 160, and at the same time, the nozzle part 204 injects the sealant to form a seal line 331 between the first side 101 and the column spacer 150.

Although, not shown in figure, additional column spacer dam lines may be formed in forming the outermost column spacers, such as the column spacers adjacent to the second, third and fourth sides 102, 103 and 104 of the first base substrate 110. Thus, the tracking part 203 tracks the additional column spacer dam lines and the nozzle part 204 injects the sealant at the same time, to form additional seal lines adjacent to each of the second, third and fourth sides 102, 103 and 104 of the first base substrate 110.

According to one or more exemplary embodiment of the invention, the sealant dispenser includes the tracking part and the nozzle part, and thus tracks the tracking line and injects the sealant at the same time. Thus, a distance between the tracking line and the seal line may be uniformly maintained and a positioning error of the seal line may be decreased.

In one exemplary embodiment, for example, the tracking line tracked by the tracking part is formed via photolithography, and thus the positioning error of the tracking line is very small. Thus, the positioning error of the seal line may be decreased.

In addition, the tracking line may be a continuous line on the first substrate which includes a switching element. The continuous line may include, for example, the gate line, the data line, the color spacer dam line, and so on, or one of the lines on the second substrate facing the first substrate, for example, a line of the light blocking layer, the color filter dam line, and so on. Thus, an optimal tracking line may be selected based on a design of the display panel. Here, even though the tracking line is changed, the distance between the tracking part and the nozzle part is changeable, and thus the seal line may be formed in substantially a same location.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifies to the disclosed exemplary embodiments, as well as other exemplary embodiments, are intended to be included within the scope of the appended claims. The invention is defined by the following claims, with equivalents of the claims to be included therein.

What is claimed is:

1. A method of sealing a display panel, the method comprising:
    providing a first substrate and a second substrate facing each other;
    tracking a tracking line on the first substrate or the second substrate, and at a same time, forming a seal line spaced apart from the tracking line by a predetermined distance on the first substrate or the second substrate, respectively, using a sealant dispenser;
    combining the first substrate with the second substrate; and
    providing a liquid crystal between the first and second substrates.

2. The method of claim 1,
    wherein the first substrate comprises a first base substrate, a gate line on the first base substrate and extending along a first direction, and a data line on the first base substrate and extending along a second direction crossing the first direction,
    wherein the tracking line is the gate line or the data line.

3. The method of claim 2, wherein
    the first substrate further comprises a plurality of gate lines and a plurality of data lines, and
    the tracking line is a pair of outermost gate lines at opposite sides of the first substrate, and a pair of outermost data lines at opposite sides of the first substrate.

4. The method of claim 1,
    wherein the first substrate comprises:
        a plurality of column spacers respectively extending along first and second directions crossing each other, and
        a column spacer dam line substantially parallel with the plurality of column spacers, and
    wherein the tracking line is the column spacer dam line.

5. The method of claim 1,
    wherein the second substrate comprises:
        a second base substrate, and
        a light blocking layer on the second base substrate and extending along each of first and second directions crossing each other, and
    wherein the tracking line is the light blocking layer.

6. The method of claim 1, wherein
    the second substrate comprises:
        a plurality of color filters respectively extending along first and second directions crossing each other, and
        a color filter dam line substantially parallel with the plurality of color filters, and
    wherein the tracking line is the color filter dam line.

7. The method of claim 1,
    wherein the sealant dispenser comprises a tracking part and a nozzle part;
    the method further comprising:
    optimizing a distance between the tracking part and the nozzle part of the sealant dispenser by considering a position of the tracking line on the first substrate or the second substrate and a desired position of the seal line on the first substrate or the second substrate, respectively, before the forming a seal line.

8. The method of claim 7, wherein
    the display panel comprise a display area and a non-display area, and
    the seal line is formed in the non-display area of the display panel.

* * * * *